US009732952B2

(12) United States Patent
Freill

(10) Patent No.: US 9,732,952 B2
(45) Date of Patent: Aug. 15, 2017

(54) LOW VOLTAGE LIGHTING ASSEMBLY AND SYSTEM

(71) Applicant: POE Lighting Ltd., Carleton Place (CA)

(72) Inventor: Peter Freill, Carleton Place (CA)

(73) Assignee: POE LIGHTING LTD., Carleton Place (CA)

(*) Notice: Subject to any disclaimer, the term of this patent is extended or adjusted under 35 U.S.C. 154(b) by 0 days.

(21) Appl. No.: 15/079,500

(22) Filed: Mar. 24, 2016

(65) Prior Publication Data

US 2016/0334089 A1 Nov. 17, 2016

(30) Foreign Application Priority Data

May 14, 2015 (CA) ..................................... 2891165

(51) Int. Cl.
*H01R 29/00* (2006.01)
*F21V 23/06* (2006.01)
(Continued)

(52) U.S. Cl.
CPC ............ *F21V 23/06* (2013.01); *F21V 23/001* (2013.01); *H05B 33/0845* (2013.01); *F21Y 2101/02* (2013.01)

(58) Field of Classification Search
CPC H01R 13/7175; H01R 13/717; H01R 12/716; H01R 13/518; H01R 24/64;
(Continued)

(56) References Cited

U.S. PATENT DOCUMENTS 5,410,458 A 4/1995 Bell
7,066,742 B2 * 6/2006 Liang .................. G06K 19/077 439/606
(Continued)

FOREIGN PATENT DOCUMENTS

CA 1114347 A 12/1981
CA 2233109 A1 9/1999
(Continued)

*Primary Examiner* — Minh D A
(74) *Attorney, Agent, or Firm* — Stephen J. Scribner

(57) ABSTRACT

This invention provides low voltage lighting assemblies and lighting systems that are easy to install, and are particularly useful in landscape lighting applications. Electrical connections between all components, including lighting assemblies, switches, power supplies, etc., are simplified through use of connectors. In one embodiment a lighting assembly comprises a circuit card having first and second zones, and a spanning zone that separates the first zone from the second zone by a selected distance. The electrical connectors and other elements are disposed in the first zone, and at least one lighting element such as an LED is disposed in the second zone. Installation of the embodiments requires little or no modification of the structures in which they are installed, since the spanning zone is adapted to span across the structure. The electrical connectors and other elements in the first zone are concealed by the structure, and substantially only the compact, low-profile second zone with the LED is exposed, producing a highly aesthetic result.

17 Claims, 6 Drawing Sheets

(51) Int. Cl.
*H05B 33/08* (2006.01)
*F21V 23/00* (2015.01)
*F21Y 101/02* (2006.01)

(58) Field of Classification Search
CPC H01R 12/721; H01R 12/712; H01R 13/6658; H01R 24/62; H01R 12/732; H01R 25/162; H01R 43/205; H01R 43/26; H01R 29/00; H01R 31/00; H01R 9/07; H01R 9/2408; H01R 9/28; H01R 13/2421; H01R 13/465; H01R 13/631; H04Q 1/142; G06F 13/409; H05K 1/117; H05K 2201/09181; H05K 2201/10189; H05K 3/308; H05K 3/3447
USPC ... 439/43, 50, 55, 56, 59, 60, 62, 65, 78, 79
See application file for complete search history.

(56) References Cited

U.S. PATENT DOCUMENTS

| | | | | |
|---|---|---|---|---|
| 7,180,736 | B2 | 2/2007 | Glovatsky et al. | |
| 7,699,489 | B2 | 4/2010 | Hagen | |
| 7,878,692 | B2 | 2/2011 | Soderman et al. | |
| 8,002,447 | B2 | 8/2011 | Patti | |
| 8,011,794 | B1 | 9/2011 | Sivertsen | |
| 8,066,398 | B2 | 11/2011 | Hartman | |
| 8,313,208 | B2 | 11/2012 | Tyson et al. | |
| 8,344,641 | B1 | 1/2013 | Isaacson et al. | |
| 8,534,873 | B1 | 9/2013 | Soderman et al. | |
| 8,600,488 | B2 | 12/2013 | Mohler et al. | |
| 8,627,609 | B2 | 1/2014 | Beausolell | |
| 8,672,502 | B2 | 3/2014 | Hartman | |
| 8,783,816 | B2 | 7/2014 | Masuda | |
| 9,004,714 | B2 | 4/2015 | Hartman | |
| 9,080,760 | B1 | 7/2015 | Soderman et al. | |
| 2011/0019398 | A1* | 1/2011 | Bishop | H05K 1/142 362/225 |
| 2012/0270436 | A1* | 10/2012 | Blythe | H01R 13/641 439/490 |

FOREIGN PATENT DOCUMENTS

| | | | |
|---|---|---|---|
| CA | 2359217 | A1 | 8/2000 |
| CA | 2062987 | C | 12/2001 |
| CA | 2365695 | A1 | 6/2002 |
| CA | 2518249 | A1 | 9/2003 |
| CA | 2419746 | A1 | 8/2004 |
| CA | 2491104 | A1 | 7/2005 |
| CA | 2603604 | A1 | 10/2006 |
| CA | 2542441 | A1 | 12/2006 |
| CA | 2626729 | A1 | 5/2007 |
| CA | 2661412 | A1 | 3/2008 |
| CA | 2703933 | A1 | 5/2009 |
| CA | 2654119 | A1 | 8/2009 |
| CA | 2721486 | A1 | 10/2009 |
| CA | 2749472 | A1 | 7/2010 |
| CA | 2758017 | A1 | 10/2010 |
| CA | 2805851 | A1 | 4/2011 |
| CA | 2782302 | A1 | 6/2011 |
| CA | 2794644 | A1 | 10/2011 |
| CA | 2797486 | A1 | 11/2011 |
| CA | 2801924 | A1 | 12/2011 |
| CA | 2810658 | A1 | 3/2012 |
| CA | 2813718 | A1 | 4/2012 |
| CA | 2813731 | A1 | 4/2012 |
| CA | 2782489 | A1 | 1/2013 |
| CA | 2857497 | A1 | 6/2013 |
| CA | 2875192 | A1 | 12/2013 |
| CA | 2879818 | A1 | 1/2014 |
| CN | 103095465 | A | 5/2013 |
| EP | 2701338 | A1 | 2/2014 |
| WO | WO2013/112481 | A1 | 8/2013 |

* cited by examiner

LOW VOLTAGE LIGHTING ASSEMBLY AND SYSTEM

FIELD

This invention relates to lighting assemblies and lighting systems employing the assemblies. The assemblies and systems are low voltage and easy to install, and are particularly useful in landscape lighting applications.

BACKGROUND

Low voltage lighting such as lighting based on light emitting diode (LED) technology is gaining popularity because of its low power consumption, freedom from potential dangers associated with higher power such as standard household power (e.g., 120 VAC), and consequent ease of installation which may not require a qualified electrician.

However, despite these advantages, most currently-available low voltage lighting assemblies and systems lack features that render them easy to install. For example, in some cases installation requires splicing of wires, which may be onerous for the average home owner as well as for contractors without special training. Such wiring may, in turn, require suitable protection such as junction boxes, and may introduce reliability problems where splice connections are not completed properly. In other cases, existing structures may require substantial modification to accept or mount a lighting assembly. In yet other cases, components may be bulky and difficult to conceal without elaborate measures, making installation difficult and detracting from aesthetic appeal.

SUMMARY

Described herein is a low voltage lighting assembly. In one embodiment, the low voltage lighting assembly comprises: a circuit card; at least one electrical connector disposed on the circuit card that is adapted to receive electrical power from a mating electrical connector removably connected thereto; at least one electronic element disposed on the circuit card; and at least one lighting element disposed on the circuit card that produces light from the received electrical power. In one embodiment, at least two electrical connectors are disposed on the circuit card. In one embodiment, the at least one lighting element comprises at least one LED. In one embodiment, the at least one electronic element provides at least one of voltage converting, voltage regulating, current limiting, filtering, decoding of information, and switching. In one embodiment, at least two electrical connectors are disposed on the circuit card. In one embodiment, the at least one electrical connector comprises an RJ45 connector.

In another embodiment, the low voltage lighting assembly comprises: a circuit card having a first zone, a second zone, and a spanning zone that separates the first zone from the second zone by a selected distance; at least one electrical connector disposed on the first zone of the circuit card that is adapted to receive electrical power from a mating electrical connector removably connected thereto; at least one electronic element disposed on the first zone of the circuit card; at least one lighting element disposed on the second zone of the circuit card that produces light from the received electrical power; wherein the spanning zone is adapted to span across a structure such that the first zone is substantially concealed by the structure.

In one embodiment, the spanning zone only includes conductors that conduct electrical power from the at least one electronic element to the at least one lighting element. The spanning zone may have a thickness that is substantially the same as a thickness of the circuit card. In various embodiments, the selected distance is about 2 cm to about 100 cm.

In one embodiment, the at least one lighting element comprises at least one LED.

In one embodiment, the at least one electronic element provides at least one of voltage converting, voltage regulating, current limiting, filtering, decoding of information, and switching.

In one embodiment, at least two electrical connectors are disposed on the circuit card. The at least two electrical connectors may be disposed on the first zone of the circuit card.

In one embodiment, the at least one electrical connector comprises an RJ45 connector.

Also described herein is a low voltage lighting system, comprising: at least one low voltage lighting assembly as described herein; a low voltage power supply including at least one electrical connector that outputs electrical power for the at least one lighting assembly; and at least one cable including mating electrical connectors that connects the at least one low voltage lighting assembly to the low voltage power supply.

The low voltage lighting system may comprise at least two low voltage lighting assemblies; wherein the at least two low voltage lighting assemblies and the low voltage power supply are connected together with at least two cables including mating electrical connectors.

The low voltage lighting system may comprise at least one switch module; wherein the at least one low voltage lighting assembly, the at least one switch module, and the low voltage power supply are connected together with at least two cables including mating electrical connectors.

The at least one switch module may comprise a manual switch, a manual dimmer, a timer, a photocell, a proximity sensor, or a combination thereof.

In one embodiment, the at least one switch module comprises a circuit that provides switching information to control a state of the at least one low voltage lighting assembly; wherein the switching information controls at least one of on/off state, intensity, and colour of light produced by the at least one low voltage lighting assembly.

In one embodiment, the low voltage lighting system comprises at least two low voltage lighting assemblies; wherein the switching information controls at least one of on/off state, intensity, and colour of light produced by each of the at least two low voltage lighting assemblies independently.

In one embodiment, the low voltage lighting system includes at least one switch module that provides power on/off control to the at least one low voltage lighting assembly.

In one embodiment, the electrical connectors of the low voltage lighting system comprise RJ45 connectors.

In one embodiment, the low voltage lighting system includes at least one LED.

Also described herein is a method for implementing low voltage lighting. In one embodiment the method comprises providing a low voltage lighting assembly by disposing on a circuit card: at least one electrical connector that is adapted to receive electrical power from a mating electrical connector removably connected thereto; at least one electronic element; and at least one lighting element that produces light from the received electrical power.

In another embodiment the method comprises: grouping electrical elements of a low voltage lighting assembly on a circuit card in first and second zones such that the first and second zones are separated by a spanning zone; disposing in the first zone (i) at least one electrical connector that is adapted to receive electrical power from a mating electrical connector removably connected thereto, and (ii) at least one electronic element; disposing in the second zone at least one lighting element that produces light from the received electrical power; wherein the spanning zone is adapted to span across a structure such that the first zone is substantially concealed by the structure. In one embodiment the method may comprise disposing only conductors in the spanning zone; wherein the conductors conduct electrical power from the at least one electronic element to the at least one lighting element.

In one embodiment, the method comprises using at least one lighting element comprising at least one LED.

The method may comprise using at least one electronic element that provides at least one of voltage converting, voltage regulating, current limiting, filtering, decoding of information, and switching.

The method may further comprise: providing a low voltage power supply including at least one electrical connector that outputs electrical power for the at least one lighting assembly; and connecting the low voltage power supply to the at least one lighting assembly using at least one cable including mating electrical connectors.

In one embodiment, the method comprises connecting at least one switch module to the at least one lighting assembly and the low voltage power supply using at least one cable including mating electrical connectors.

The method may comprise connecting at least one switch module that includes a manual switch, a manual dimmer, a timer, a photocell, a proximity sensor, or a combination thereof.

The method may comprise connecting at least one switch module that provides switching information to control a state of the at least one lighting assembly; wherein the switching information controls at least one of on/off state, intensity, and colour of light produced by each of the at least one lighting assembly.

In one embodiment, the method comprises using RJ45 electrical connectors.

BRIEF DESCRIPTION OF THE DRAWINGS

For a greater understanding of the invention, and to show more clearly how it may be carried into effect, embodiments will be described, by way of example, with reference to the accompanying drawings, wherein.

DETAILED DESCRIPTION OF EMBODIMENTS

Described herein are low voltage lighting systems and assemblies suitable for indoor or outdoor installations. A low voltage lighting system according to the embodiments generally includes the following components: one or more lighting assembly, which may also be referred to as a light fixture, a power supply, and one or more cables connecting the one or more assembly to the power supply. Optionally, other components, such as one or more switch, dimmer, timer, etc., may be included in a lighting system. Electrical connections between all components are made using connectors provided on the components.

Embodiments described herein address the drawbacks of prior low voltage lighting systems by providing assemblies and systems that are easy to install in new construction, as well as in existing structures. Electrical connections are simplified through the use of cables (i.e., wires) with connectors by which components of a lighting system (e.g., power supply, lighting assembly, switch, dimmer, etc.) are interconnected, resulting in reliable electrical connections without the need for special training or skills. In some embodiments, the lighting assemblies are compact and low-profile, requiring little or no modification of existing structures for installation and concealment. Accordingly, the embodiments enable low voltage lighting installations with high aesthetic appeal while minimizing installation complexity and effort.

Embodiments are described herein primarily with respect to LED lighting. LED lighting has significant advantages over other forms of low-voltage lighting (e.g., incandescent), such as low power consumption and high efficiency, high reliability and life span, safety, compact size, colour selection, and ruggedness. Nevertheless, the invention is not limited to use of LEDs, as embodiments may be adapted to use with other forms of low voltage lighting such as halogen and incandescent. However, for convenience, the term "LED" is used herein to refer to generally to a lighting element.

Figure 1:
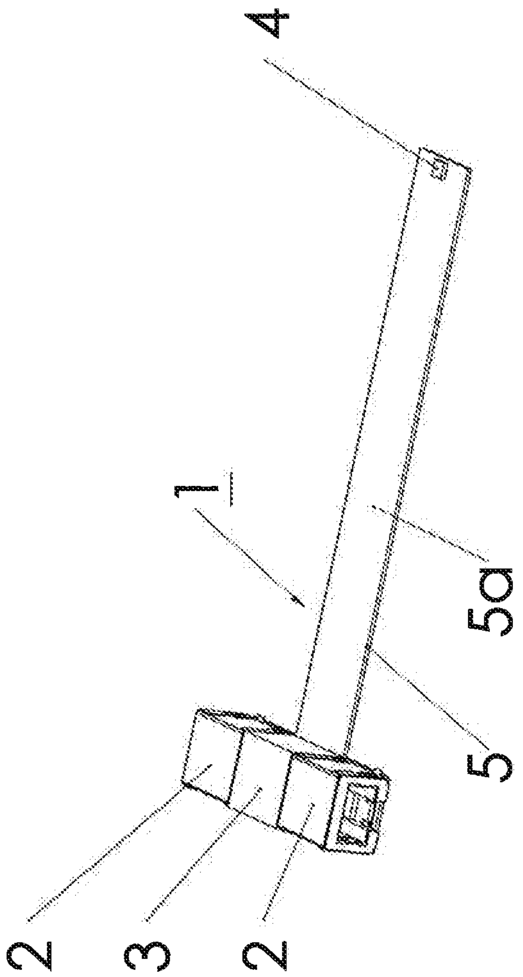
FIG. 1 is a diagram of a lighting assembly, according to one embodiment.

An example of a lighting assembly is shown in FIG. 1. According to this embodiment, the lighting assembly 1 has a circuit card 5 upon which all electrical elements are mounted. The circuit card includes multiple "zones"; that is, areas of the card that are either populated with one or more electrical elements, and at least one area of the card that is devoid of any electrical elements, other than conductors. Consequently, the latter area, referred to herein as a "spanning zone" and shown in the figures at 5*a*, is significantly thinner than the populated zones due to the lack of electrical elements, and in some embodiments may be substantially the same thickness as the card material. A connector end (or "zone") of the card is populated with electrical elements, including connectors 2 and electronic components within a housing 3. A lighting end (or "zone") of the card includes one or more LEDs 4. A lens, not shown, may optionally be mounted over the LED(s), for protection, and/or for colour, where a coloured lens is used. As can be seen in FIG. 1, the spanning zone 5*a* separates the two populated zones at each end of the card by a significant distance. The purpose of the spanning zone is to span across a structure in which it is installed, so that upon installation the two populated zones are separated to opposite sides of the structure. Alternatively, the connector zone may be located within the structure, but separated from the lighting zone which is located outside of the structure. The distance that the connector zone and the lighting zone are separated by the spanning zone may be selected for a given installation, as discussed in detail below. Thus, assemblies are provided with various lengths of the spanning zone 5*a*.

Accordingly, the lighting assembling, by virtue of the spanning zone, is adapted to span across a structure or building material in which it is installed, with only minimal or no modification of the structure. As a result, the connectors and other components of the lighting assembly are hidden behind/within the structure such that substantially only the compact, low-profile lighting zone with the LED is exposed, producing a highly aesthetic result.

The circuit card 5 may be made of any suitable material known in the art, such as, for example, a copper-clad glass fiber epoxy laminate (e.g., FR-4), with conductors and provisions for mounting electrical elements (e.g., by soldering) provided by etching the copper, as is well-known in the art. Thus, although not shown in FIG. 1, the circuit card 5 resembles a circuit board (i.e., a printed circuit board (PCB)) in that it includes conductors for conducting power between electrical elements and areas for mounting of electrical elements. However, according to embodiments described herein, conductors are protected and afforded electrical insulation by, for example, covering with a plastic, polymer, epoxy, or silicon material, and/or "sandwiching" between layers of electrically-insulating material, such as FR-4 card material. Thus, a lighting assembly comprising a card and electrical elements mounted thereon is completely or substantially suitable for deployment or installation as-is, without further protection. Of course, a lighting assembly may also be deployed/installed in a housing, electrical box, or other protective covering if desired or as a particular installation may warrant. For example, an assembly may be provided in an aesthetically appealing housing for deployment where it is visible.

As shown in FIG. 1, the connector zone of a lighting assembly 1 may include two (i.e., first and second) electrical connectors 2. This facilitates easy connection of multiple (i.e., two or more) assemblies, wherein the first connector receives power from an appropriate low voltage power supply via a first cable connected thereto, and power is available at the second connector so that a second cable may be connected thereto, which carries power to a second assembly, and so on. The designation of "first" and "second" connector is arbitrary, as the connectors are interchangeable. In this way, multiple assemblies may be easily "daisy-chained" together to create a string of lights. The number of assemblies that may be connected together in this manner will of course be determined by the power requirements of the individual assemblies/LEDs, the design of the associated power supply, and the limitations (i.e., electrical ratings) of the components used. The last assembly in a string may be terminated by inserting a "dummy" plug or cap into the unused connector, or by sealing the unused connector with a sealant such as epoxy, silicon, or dielectric grease. However, use of a dummy plug or cap advantageously allows for future expansion, since the dummy plug or cap can be removed and a further cable/assembly connected in its place. Alternatively, an assembly may be provided with only one connector 2, for use as the last assembly in a string.

The electronic components within housing 3 may perform one or more functions such as voltage converting (e.g., rectifying), voltage regulating, current limiting, and switching. Switching may include decoding switching information received together with input power. For example, where two or more assemblies are connected together, switching information may be provided to allow independent control of the two or more lights. The messaging protocols for such functions, for example, Ethernet and Control Area Network (CAN) are generally well-known in the art and, for the sake of brevity, are not described here.

The connectors 2 may be implemented with various known connector systems (i.e., "male-female" or "plug-jack" electrical connectors), with appropriate electrical ratings. In one embodiment, the connector "jacks" (and associated plugs that mate with the jacks) are standard RJ45 connectors, which are modular eight pin connectors, also known as IEC 60603-7 8P8C. These connectors are readily available, with circuit board mountable jacks as well as in-line jacks and plugs. In one embodiment, the RJ45 connector system uses pin four and/or pin five for positive DC power; and pin seven and/or pin eight for the negative return (e.g., as defined for power-over-ethernet (PoE) IEEE 802.3af standard).

Figure 2:
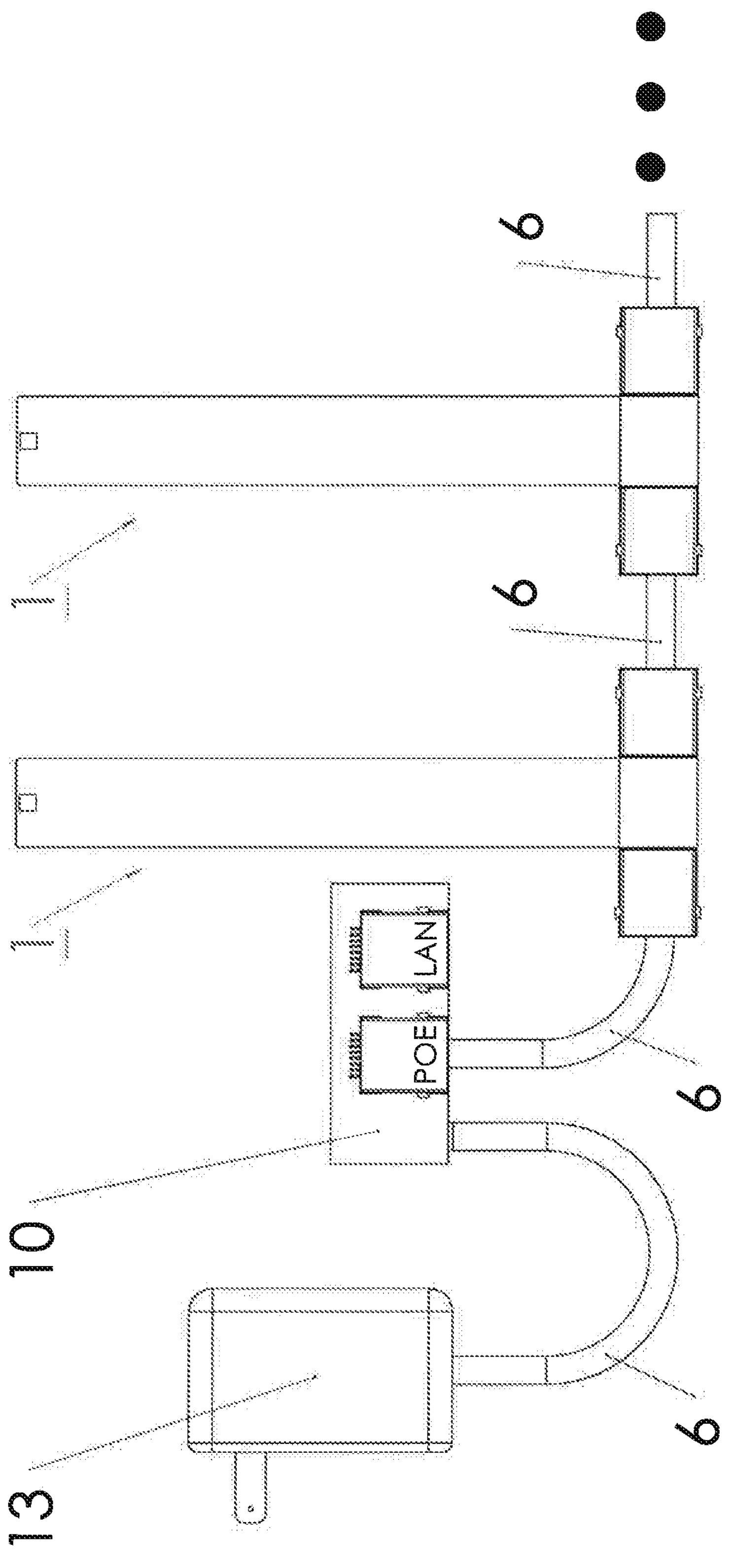
FIG. 2 is a diagram showing connection of components of a lighting system, according to one embodiment.

FIG. 2 shows a generalized view of a lighting system according to one embodiment. The system includes a power supply 13, a power distribution unit 10, and two or more lighting assemblies 1. The power supply 13 and the power distribution unit 10 may be combined into a single unit. Although the power supply 13 is shown as a typical power adapter that plugs into a standard 120 VAC power outlet, other styles of power supplies could also be used. Generally the power supply outputs DC voltage; however, systems using an AC output may also be used. For example, systems that do not employ DC lighting elements may use AC power. Alternatively, an AC power supply can be used, and appropriate rectification circuitry can be provided elsewhere in the system, such as on lighting assemblies. The power supply may also be implemented with a battery. A rechargeable power supply, including one or more batteries and a renewable power source such as photo-voltaic (PV) cells, may be used, and may be particularly advantageous in remote installations. In various embodiments, the power supply may provide, but is not limited to, 5-60 VDC, or 12-24 VAC. The voltage may be selected as best suited for a given application, the type of lighting elements used, etc. For example, where interconnecting wires are long, higher voltage is preferred to reduce losses. According to one embodiment that is applicable to a range of installation situations, it has found that an output voltage of 48 VDC is suitable. Embodiments may include a separated (or "safety") extra low voltage (SELV) power supply in which the output is limited to selected voltage.

Figure 5:
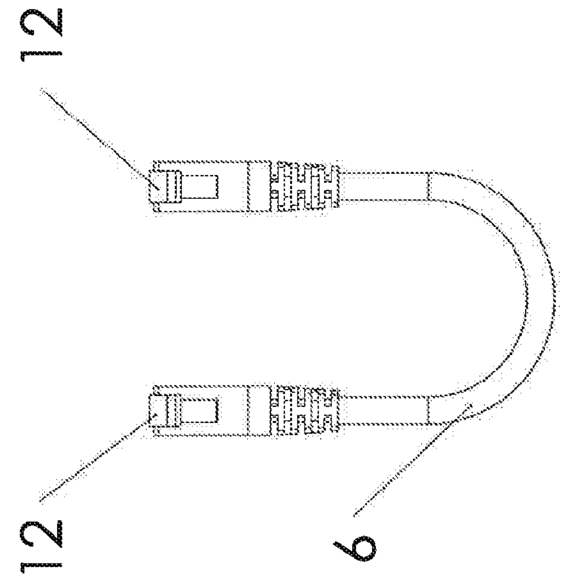
FIG. 5 is a diagram of an electrical cable and connectors suitable for use with embodiments described herein.

The lighting assemblies 1 are connected together via a connector cable 6, and another connector cable 6 of the same style connects the first lighting assembly of the series to the power distribution unit 10. As shown in FIG. 5, cables 6 may be provided pre-assembled (i.e., with connectors installed) in various lengths, and may be rated for direct-burial usage, where required. In FIG. 5, the connectors 12 may be plugs that are received by the connectors 2, i.e., jacks, mounted on the lighting assemblies. Cables may also be provided in "T", "Y", "H", or other configurations to facilitate branching connections. Similarly, modules comprising a rigid housing and multiple connectors may be provided to facilitate "T", "Y", "H", or other configurations of branching connections.

Figure 6:
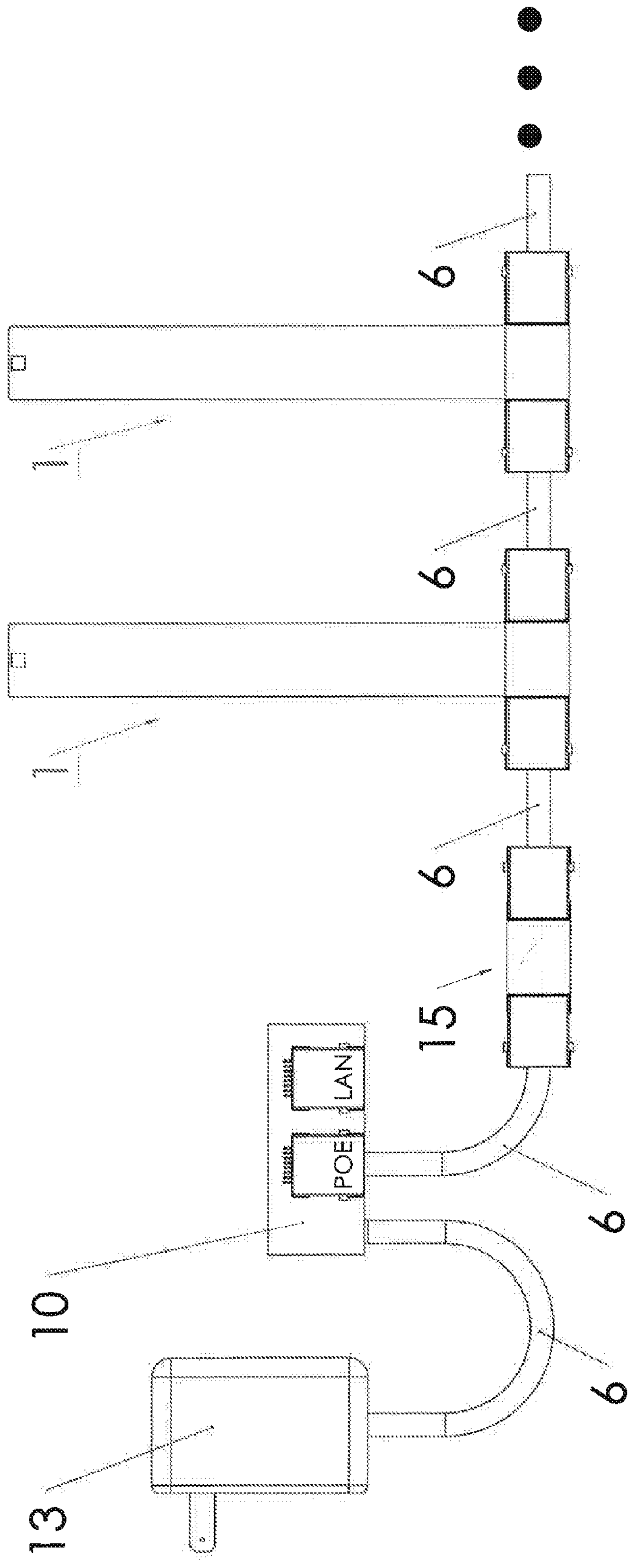
FIG. 6 is a diagram showing connection of components of a lighting system, including a switch, according to one embodiment.

FIG. 6 shows an embodiment of a lighting system with interconnected components, similar to that shown in FIG. 2, except that a switch module 15 is included. In one embodiment the switch module 15 may provide a simple on/off function for the string of lighting assemblies. In other embodiments the switch module 15 may include other functions, such as, for example, a dimmer, a timer, etc. The switch module includes connectors so that it can conveniently be connected into the system using cables 6.

As noted above, the connectors of the lighting assemblies may be implemented with standard RJ45 connectors. Accordingly, in some embodiments a cable 6 may be implemented using a standard network cable, such as a cable referred to as category 5, 5e, or 6 according to standard ANSI/TIA/EIA-568, provided that the power requirements of the lighting system is compatible with the ratings of such connectors and cables. Also, the power distribution unit 10 may be implemented with a PoE module, such as a passive PoE injector, which provides a DC voltage and standardized pin usage compatible with the RJ45 connectors. As used herein, "passive" means that the power is placed on the appropriate lines without negotiating power levels with the powered device (PD) (i.e., lighting assembly, and other optional components in the system). Some embodiments may use a power source equipment (PSE) module that communicates with the PD, and does not place power on the line if the PD does not respond correctly. It will, of course, be appreciated that use of standard PoE hardware and RJ45 connectors is a convenient way to implement the embodiments. Custom hardware, such as power supplies, and cables, and other connector systems may also be employed.

A multi-conductor cable and multi-pin connector system may conveniently provide additional conductors and pins (i.e., in addition to those used for powering an assembly) for carrying control information. For example, four pins on an RJ45 connector may optionally be used to send control information to one or more lighting assemblies. The control information may be used to control aspects of the lighting assemblies, such as intensity and on/off state. Lighting assemblies may be controlled all together as one group, or in various groupings as subgroups, or individually. The control information may be programmed into or set by the power supply 13 or the power distribution unit 10. Alternatively, a switch module containing the control information may be added to the system simply by connecting it into the system using a cable 6, at a convenient location. For example, a switch module may include a circuit card and two connector jacks, and one or more of a switch circuit, a circuit that stores and provides the control information, a timer, a manual switch, and a manual dimmer. Optionally, a switch module may include an environment sensing device (e.g., one or more of a photocell to sense ambient light, and a motion sensor) and control on/off state and or light intensity of one or more assembles accordingly. Optionally, a switch module may be programmable so that control of one or more assemblies of a lighting system may be customized. Further, multiple switch modules may be included in a lighting system to provide multiple control points, analogous to that provided by 3-way and 4-way switches in standard 120 VAC household wiring, using appropriate control signals with the control information, optionally with decoding of the information by the electronic components in the housing 3.

Embodiments described herein are suitable for indoor or outdoor installations. For outdoor installations, a protective layer or coating may be disposed on the circuit card 5 to protect the assembly from moisture, corrosive materials, and ultraviolet light. In addition, a water-displacing (e.g., hydrophobic) material, such as a dielectric grease or silicon, may be applied to the connectors before and/or after connecting them together, to provide a moisture-proof connection.

Figure 3B:
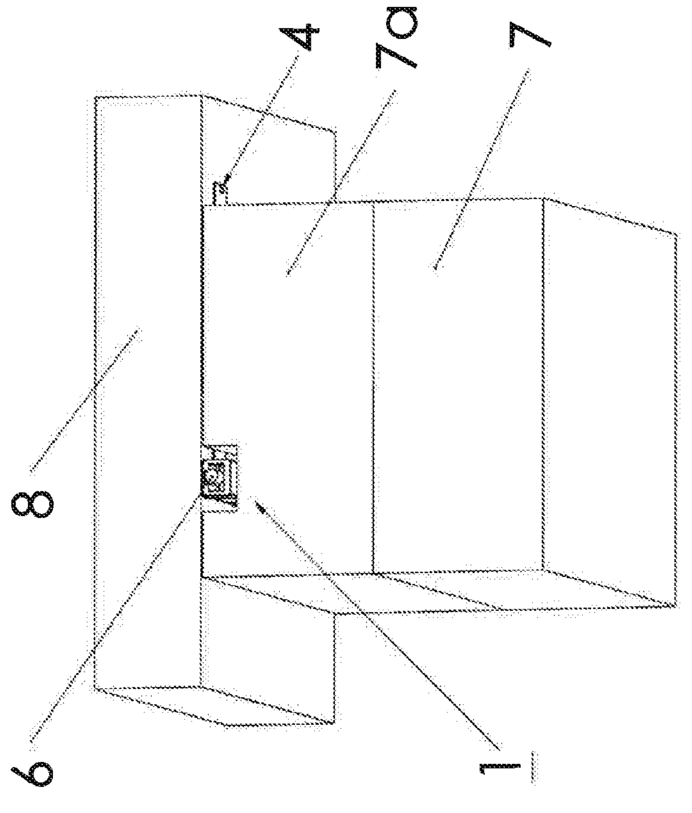
FIGS. 3*a* and 3*b* are diagrams of lighting assemblies installed in hardscape walls.
Figure 3A:
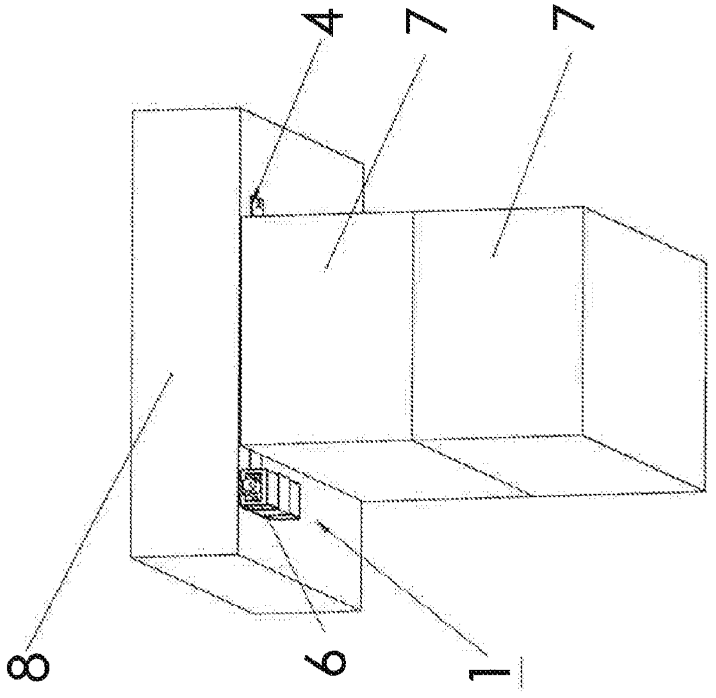

The embodiment of FIG. 1 is particularly well suited for installation on walls, steps, and stairs, cabinets, pillars, posts, etc. FIGS. 3*a* and 3*b* show examples of such an installation in a block material as may be used in landscaping (i.e., hardscape) for retaining walls, patios, steps, stairs, etc. Such structures may include one or more courses of blocks 7 and a cap 8 fixed thereto. In the example shown in FIG. 3*a*, an assembly 1 is installed such that the spanning zone 5*a* spans the width of the block 7, the LED 4 is facing downwards on the outward side of the wall, and the connectors 2 and housing 3 are concealed behind the wall. Since the spanning zone 5*a* is thin, being made from multiple, e.g., three or four layers, including two or more insulating layers of circuit board material (e.g., FR-4), deployment requires simply placing it on the upper block 7 with the spanning zone 5*a* spanning the block, and placing the cap 8 on top. The spanning zone 5*a* is constructed thin enough that its presence produces a negligible change in height of the cap 8. However, an assembly may be provided with an additional piece of material substantially the same thickness as the spanning zone, to be used as a shim for the cap 8 in the event that the assembly causes the cap 8 to wobble. The assembly and/or the cap 8 may be secured using a suitable adhesive or caulking, if desired. Electrical connections may then be easily completed by connecting one or two cables 6 to the connectors, and applying a dielectric sealant such as dielectric grease.

FIG. 3*b* shows an example where an assembly 1 is installed such that bulky components (i.e., connectors 2, housing 3, and cables 6) are hidden inside a channel in a block 7*a*. In particular, certain landscaping block products are available with such channels formed therein, which conveniently accept an assembly and cables as shown in the figure.

Figure 4:
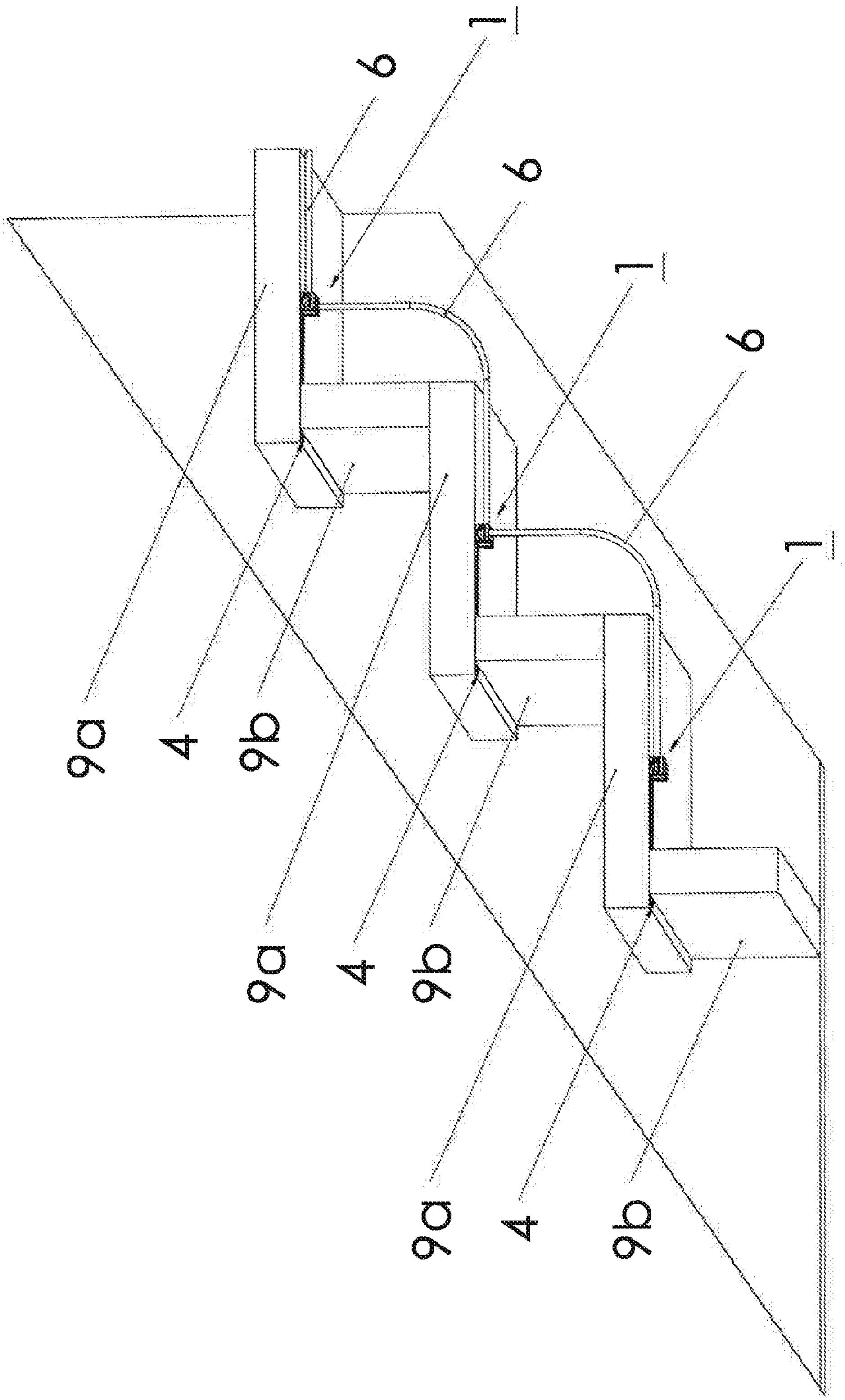
FIG. 4 is a diagram of lighting assemblies installed in a staircase, according to one embodiment.

FIG. 4 is an illustration showing installation of lighting assemblies 1 in a staircase. The staircase may be indoors or outdoors, such as wooden stairs of a deck. Each assembly 1 is mounted to the underside of a stair tread 9*a*, behind a riser 9*b*. Each assembly may have one or more feature to facilitate easy mounting, such as one or more holes to accept a mounting screw (not shown). Such a feature may be required where no risers 9*b* are used. The spanning zone 5*a* spans the thickness of the riser 9*b* material, such that the LED 4 is exposed under the front overhang of the tread 9*b*. Interconnecting cables 6 may be easily routed under the steps, and secured with suitable anchors (not shown).

As noted above, the spanning zone 5*a* of the assembly 1 may be provided in a length suitable for a given application. For example, in the embodiments shown in FIG. 3*a*, the spanning zone 5*a* is long enough to span the width of the blocks 7 of a hardscape wall; whereas in FIG. 3*b*, the spanning zone 5*a* is sized to take advantage of the existing channel in the block 7*a*. Further, in FIG. 4, the spanning zone may be sized to span the thickness of the riser board 9*b* of a wooden staircase. The spanning zone 5*a* may be provided in a length suitable for installation in a given material, for example, but not limited to, 2-100 cm long. In various embodiments, the spanning zone is 2-50 cm long, or 2-30 cm long, or 2-20 cm long. In other embodiments, the spanning zone is 4-50 cm long, or 4-30 cm long, or 4-20 cm. Other lengths may also be provided. In some embodiments the free zone is flexible, so that it may bend and at least partially conform to shape of the overlying and/or underlying structures.

It will be appreciated that in the typical outdoor installations shown in the examples of FIGS. 3*a*, 3*b*, and 4, no modification, or only minimal modification of the structures is required. In these installations the assemblies are mostly hidden behind structures such that substantially only the compact, low-profile portion of the assembly with the LED is exposed. Accordingly, the assemblies and cabling are virtually entirely concealed, producing a highly aesthetic result.

EQUIVALENTS

While the invention has been described with respect to illustrative embodiments thereof, it will be understood that various changes may be made to the embodiments without departing from the scope of the invention. Accordingly, the described embodiments are to be considered merely exemplary and the invention is not to be limited thereby.

The invention claimed is:

1. A low voltage lighting assembly, comprising;

a circuit card having a first zone, a second zone, and a spanning zone that separates the first zone from the second zone by a selected distance;

at least one electrical connector disposed on the first zone of the circuit card that is adapted to receive electrical power from a mating electrical connector removably connected thereto;

at least one electronic element disposed on the first zone of the circuit card;

at least one lighting element that produces light from the electrical power;

wherein the at least one lighting element is disposed on the second zone and not on the first zone or on the spanning zone;

wherein the spanning zone only includes conductors that conduct electrical power from the first zone to the at least one lighting element, and is adapted to span across a structure such that the first zone is substantially concealed by the structure.

2. The low voltage lighting assembly of claim 1, wherein the spanning zone has a thickness that is substantially the same as a thickness of the circuit card.

3. The low voltage lighting assembly of claim 1, wherein the selected distance is about 2 cm to about 100 cm.

4. The low voltage lighting assembly of claim 1, wherein:

the at least one lighting element comprises at least one LED; or the at least one electrical connector comprises an RJ45 connector; or the at least one lighting element comprises at least one LED and the at least one electrical connector comprises an RJ45 connector.

5. The low voltage lighting assembly of claim 1, wherein the at least one electronic element provides at least one of voltage converting, voltage regulating, current limiting, filtering, decoding of information, and switching.

6. The low voltage lighting assembly of claim 1, comprising at least two electrical connectors disposed on the first zone of the circuit card.

7. A low voltage lighting system, comprising:

at least one low voltage lighting assembly of claim 1;

a low voltage power supply including at least one electrical connector that outputs electrical power for the at least one lighting assembly; and at least one cable including mating electrical connectors that connects the at least one low voltage lighting assembly to the low voltage power supply.

8. The low voltage lighting system of claim 7, comprising:

at least two low voltage lighting assemblies;

wherein the at least two low voltage lighting assemblies and the low voltage power supply are connected together with at least two cables including mating electrical connectors.

9. The low voltage lighting system of claim 7, comprising:

at least one switch module;

wherein the at least one low voltage lighting assembly, the at least one switch module, and the low voltage power supply are connected together with at least two cables including mating electrical connectors.

10. The low voltage lighting system of claim 9, wherein the at least one switch module comprises:

a manual switch, a manual dimmer, a timer, a photocell, a proximity sensor, or a combination thereof; or a circuit that provides switching information to control a state of the at least one low voltage lighting assembly;

wherein the switching information controls at least one of on/off state, intensity, and colour of light produced by the at least one low voltage lighting assembly.

11. The low voltage lighting system of claim 10, comprising:

at least two low voltage lighting assemblies;

wherein the switching information controls at least one of on/off state, intensity, and colour of light produced by each of the at least two low voltage lighting assemblies independently.

12. The low voltage lighting system of claim 7, wherein:

the electrical connectors comprise RJ45 connectors; or the at least one low voltage lighting assembly includes at least one LED; or the electrical connectors comprise RJ45 connectors and the at least one low voltage lighting assembly includes at least one LED.

13. A method for implementing low voltage lighting, comprising;

grouping electrical elements of a low voltage lighting assembly on a circuit card in first and second zones such that the first and second zones are separated by a spanning zone;

disposing in the first zone (i) at least one electrical connector that is adapted to receive electrical power from a mating electrical connector removably connected thereto, and (ii) at least one electronic element;

disposing in the second zone at least one lighting element that produces light from the received electrical power;

disposing only conductors in the spanning zone, wherein the conductors conduct electrical power from the first zone to the at least one lighting element;

wherein a lighting element is not disposed in the first zone or in the spanning zone;

wherein the spanning zone is adapted to span across a structure such that the first zone is substantially concealed by the structure.

14. The method of claim 13, wherein:

the at least one lighting element comprises at least one LED; or the at least one electrical connector comprises at least one RJ45 connector; or the at least one lighting element comprises at least one LED and the at least one electrical connector comprises at least one RJ45 connector.

15. The method of claim 13, wherein the at least one electronic element provides at least one of voltage converting, voltage regulating, current limiting, filtering, decoding of information, and switching.

16. The method of claim 13, further comprising:

providing a low voltage power supply including at least one electrical connector that outputs electrical power for one or more of said lighting assembly; and connecting the low voltage power supply to the one or more lighting assembly using at least one cable including mating electrical connectors.

17. The method of claim 16, comprising:

connecting at least one switch module to the at least one lighting assembly and the low voltage power supply using at least one cable including mating electrical connectors;

wherein the at least one switch module includes a manual switch, a manual dimmer, a timer, a photocell, a proximity sensor, or a combination thereof; or wherein the at least one switch module provides switching information to control at least one lighting assembly;

wherein the switching information controls at least one of on/off state, intensity, and colour of light produced by each of the at least one lighting assembly.

* * * * *